(12) United States Patent
Arai et al.

(10) Patent No.: US 6,849,824 B2
(45) Date of Patent: Feb. 1, 2005

(54) MULTIBEAM LASER DRILLING APPARATUS

(75) Inventors: Kunio Arai, Ebina (JP); Kenji Suzuki, Ebina (JP)

(73) Assignee: Hitachi Via Mechanics, Ltd., Ebina (JP)

( * ) Notice: Subject to any disclaimer, the term of this patent is extended or adjusted under 35 U.S.C. 154(b) by 0 days.

(21) Appl. No.: 10/740,817

(22) Filed: Dec. 22, 2003

(65) Prior Publication Data

US 2004/0129685 A1 Jul. 8, 2004

(30) Foreign Application Priority Data

Dec. 26, 2002 (JP) ........................................ 2002-377578
May 27, 2003 (JP) ........................................ 2003-149510

(51) Int. Cl.⁷ ........................ B23K 26/38; B23K 26/06; B23K 26/067
(52) U.S. Cl. .............................. 219/121.7; 219/121.73; 219/121.77
(58) Field of Search ......................... 219/121.7, 121.73, 219/121.74, 121.75, 121.76, 121.77, 121.71

(56) References Cited

U.S. PATENT DOCUMENTS 5,856,648 A * 1/1999 Frauchiger et al. .... 219/121.61
6,521,866 B1    2/2003 Arai et al.
2002/0153361 A1   10/2002 Sakamoto et al.
2004/0104208 A1 * 6/2004 Ijima et al. ............ 219/121.77

FOREIGN PATENT DOCUMENTS

| JP | 58-33803 | 2/1983 |
|---|---|---|
| JP | 63-147138 | 6/1988 |
| JP | 11-314188 | 11/1999 |
| JP | 2000-190087 | 7/2000 |
| JP | 2000-263271 | 9/2000 |
| JP | 2001-269790 A * | 10/2001 |
| WO | WO 00/64623 | 11/2000 |

* cited by examiner

Primary Examiner—Geoffrey S. Evans
(74) Attorney, Agent, or Firm—Crowell & Moring LLP

(57) ABSTRACT

Provided is a multi-beam laser drilling apparatus for drilling a workpiece, simultaneously at two positions while telecentric errors are suppressed, in which a conventional optical system in which galvanometer mirrors are used for a first laser beam, and a galvanometer-mirror system is located close to an fθ lens in order to prevent occurrence of telecentric error. A second laser beam which has been deflected by a second galvanometer-mirror system, transmits through a polarized beam mixers and is incident upon the first galvanometer-mirror system and the fθ lens, and accordingly, the workpiece is drilled simultaneously at two positions with the use of both first and second laser beams.

17 Claims, 6 Drawing Sheets

MULTIBEAM LASER DRILLING APPARATUS

BACKGROUND OF THE INVENTION

The present invention relates to a high speed laser drilling apparatus using a plurality of laser beams.

A printed circuit board used in a mobile telephone or the like has been smaller year after year. Further, the number of holes drilled in a circuit board has been increased, that is, not less than 3,000 of micro-sized holes are formed therein.

In order to form micro-sized holes in a printed circuit board, a micro-hole drilling process using a laser beam is used. As to this process, as disclosed in JP-A-63-147138 (Refer to in particular to FIGS. 1 and 2), a laser drilling process in which two mirrors (which will be hereinbelow referred to as "galvanometer-mirror system") that are rotated around two orthogonal axes, respectively, and an fθ lens are used for converging light and positioning the converging point, has been prosperously used. As the number of micro-sized holes is increased, there has been increased demands of to increase the drilling speed. It is noted that the fθ lens is the one which is designed so that the relationship between an incident angle θ of a parallel ray beam and a light focusing point y is expressed by the formula y=fθ.

In order to speed up the drilling process, as disclosed in JP-A-2000-190087 (refer to in particular FIG. 1), there has been proposed a laser drilling apparatus in which a laser beam is divided into an S-polarized beam and a P-polarized beam by a polarizing beam splitter, and angles of these beams are determined by galvanometer-mirror systems which are operated independent of each other, and which are placed in the optical paths of these two beams, respectively, and thereafter, they are reflected by and transmitted through a polarized beam mixer (a polarizing beam splitter is conversely used) so that the beams are incident upon the fθ lens in order to simultaneously drill the circuit board at two positions.

There has been known, as prior art to the present invention, a laser drilling machine capable of simultaneously drilling a circuit board at two positions, in which a laser beam is divided into two beams with the use of two acousto-optic elements, as disclosed in JP-A-2000-263271 (Refer to in particular to FIG. 1). In the case of using two galvanometer-mirror systems for one fθ lens, due to the size of the galvanometer-mirror systems, the galvanometer-mirror systems must be placed distant from the fθ lens. Accordingly, since the galvanometer-mirror systems are remote from the focal point of the fθ lens, a deficiency which is the so-called telecentric error is generated. The telecentric error means such a phenomenon that a light beam focused by the fθ lens can not be incident at right angles upon a surface to be worked, that is, it is incident at a certain angle to the normal to the surface, since the light beam which is incident upon the fθ lens does not pass through the focal point of the lens.

On the other hand, in the case of the laser drilling device disclosed in JP-2000-263271, without increasing the number of components including the fθ lens, it has been desired to simultaneously drill a circuit board at more than three positions.

BRIEF SUMMARY OF THE INVENTION

Accordingly, an object of the present invention is to provide a laser head in which galvanometer-mirror systems are arranged, as near to an fθ lens as possible, and which can process two positions of a workpiece simultaneously with two light beams.

Further, another object of the present invention is to provide a laser processing apparatus wherein a pulse beam emitted from a single laser pulse emitter is split into a plurality of beams which are then applied to a plurality of laser heads as stated above in order to simultaneously process at not less than three positions.

To the end, according to a first aspect of the present invention, there is provided a multi-beam laser drilling apparatus in which a first laser beam of S-polarized light is reflected by a fixed mirror and is converged and positioned by a first galvanometer-mirror system and an fθ lens so as to drill a workpiece, wherein a polarized light mixer is used as the fixed mirror for reflecting the first beam, and a second laser beam of P-polarized light is deflected to a second galvanometer-mirror system so as to transmit the same from the backside of the polarized beam mixer, and is converged and positioned by the first galvanometer-mirror system and the fθ lens so as to drill the workpiece, simultaneously at two positions with the use of both first and second laser beams. It is noted here that the S-polarized beam is reflected by the polarized light mixer while the P-polarized beam is transmitted through the polarized light mixer.

By adopting a conventional optical system using a galvanometer-mirror system, the galvanometer mirror can be located near to the fθ lens for the first laser beam, and accordingly, occurrence of the telecentric error can be prevented. Further, as to the second laser beam, the telecentric error can be suppressed by decreasing angles of the second galvanometer-mirror system to small values. However, since the response speed becomes slow, the size of the first galvanometer-mirror system cannot be increased, and further, if the deflection angle of the second beam becomes larger, causing such a problem that the laser beam misses the first galvanometer-mirror system, the deflection angle cannot be increased to a large value. Thus, the distance between a converging position of the first laser beam and a converging position of the second laser beam has to be decreased. However, drilling processes of these years require to set intervals of micro-holes to values not greater than 1.5 mm, and accordingly, the distance problem does not affect the drilling process.

Further, in order to achieve the above-mentioned objects, according to a second aspect of the present invention, there are provided a multi-beam laser drilling apparatus having a laser head in which a first laser beam is reflected by a fixed mirror, and is converged and positioned by a first galvanometer-mirror system and an fθ lens so as to drill a hole in a workpiece, wherein a second galvanometer-mirror system in which one of mirrors is used as a rotatable polarized beam mixer, is provided between the fixed mirror and the first galvanometer-mirror system, a second S-polarized laser beam is incident upon the first galvanometer-mirror system and the fθ lens so as to be converged and positioned after the second S-polarized laser beam is deflected by the galvanometer-mirror system in which one of the mirrors is the polarized beam mixer, meanwhile the first laser beam is P-polarized so as to transmit through the rotatable polarized beam mixer and is then incident upon and the first galvanometer-mirror system and the fθ lens in order to drill the workpiece, simultaneously at two positions with the use of both the first laser beam and the second laser beam.

In the case of the laser head as stated above, it is similar to the laser head as in the above-mentioned first aspect of the present invention as to the first laser beam, but as to the second laser beam, the second galvanometer-mirror system can be located close to the first galvanometer-mirror system so that deflection angles of the second laser beam can be increased to larger values, thereby it is possible to increase the distance between the converged positions of the first laser beam and the second laser beam.

Further, to achieve the objects as stated above, according to a third aspect of the present invention, there is provided a laser drilling apparatus having a laser head for drilling a workpiece, simultaneously at two positions, with the use of two laser beams, that is, a first laser beam and a second laser beam, in which the first laser beam is reflected by a first fixed mirror, and is converged and positioned by a first galvanometer-mirror system and an fθ lens so as to drill the workpiece, and a polarized beam mixer is provided between the first fixed mirror and the first galvanometer-mirror system, and the first laser beam is P-polarized so as to transmit through the polarized beam mixer, and the second laser beam is S-polarized, is then deflected by a galvanometer-mirror system and reflected by the polarized beam mixer, and is converged and positioned by the first galvanometer-mirror system and the fθ lens.

With this laser head, although the angle dependence of the polarized beam mixer is severe with respect to the transmitted light, the freedom of design is increased since the transmitted light merely goes straightforward.

Further, with this laser head, the second S-polarized laser beam is reflected by the second fixed mirror, and is deflected by the second galvanometer-mirror system which is configured such that the direction of the drive shaft of the galvanometer mirror for the X-axial direction is coincident with the direction of the drive shaft of the galvanometer mirror for the X-axial direction of the first galvanometer-mirror system, while the direction of the drive shaft of the galvanometer mirror for the Y-axial direction is made orthogonal to the direction of the drive shaft of the galvanometer mirror for the Y-axial direction of the first galvanometer-mirror system, spatial interference caused by the mirror drive motors can be reduced, and accordingly, the galvanometer mirrors can be placed close to one another, thereby it is possible to further reduce telecentric errors caused by the fθ lens.

In order to achieve the above-mentioned objects, according to a fourth aspect of the present invention, there is provided a multi-beam laser drilling apparatus in which a linearly polarized pulsed laser beam emitted from a single laser oscillator is divided into two beams by a half-mirror, and each of the divided laser beams is provided to multiple optical deflectors for causing the laser beam to branch into a plurality of optical paths for every pulse so as to combine the pulsed laser beams, the polarization direction of one of the pulsed laser beams is rotated by 90 degrees so as to obtain a group of a first and a second pulsed laser beam at the same time, and pulsed laser beams generated at another time are set in another combination so as to obtain another group of plural pulsed laser beams, and they are led to a plurality of laser heads stated above, respectively.

The single pulsed laser beam is divided into two beams by the half-mirror, and after the divided pulsed laser beams are deflected and tail-cut by the optical deflectors and the polarization direction of one of the pulsed laser beams is rotated by 90 degrees so as to obtain a group of the S-polarized pulsed laser beam and the P-polarized pulsed laser beam. Since the pulsed laser beams divided by the half-mirror are simultaneous, these pulsed laser beams are simultaneously incident upon a single laser head. The next pulsed beam is deflected by the next optical deflector and is tail-cut, and thereafter, is led into another laser head. Thus, the workpiece can be drilled by a plurality of laser heads.

In a conventional optical system in which more than two optical deflectors are provided in an optical path for a laser beam so as to cause the laser beam to branch into two optical paths, since the pulsed laser beam deflected at a optical deflector and the pulsed laser beam deflected at the next optical deflector pass different numbers of optical deflectors from each other, the beams are differently expanded by thermal lens effects at the respective optical deflectors, and accordingly, there has been raised such a problem that these pulsed laser beams are different in expansion from each other. In order to solve the above-mentioned problem, the distance between the optical deflectors is adjusted so that a pulsed laser beam deflected by a optical deflector is led through the next optical deflector, and accordingly, the expansion of the beams become identical with each other.

Another objects, features and advantages of the present invention will be apparent from the following descriptions of the present invention which will be explained with reference to the accompanying drawings in which:

DETAILED DESCRIPTION OF THE INVENTION

Explanation will be made of embodiments of the present invention with reference to the accompanying drawing.
<Embodiment 1>

Figure 1:
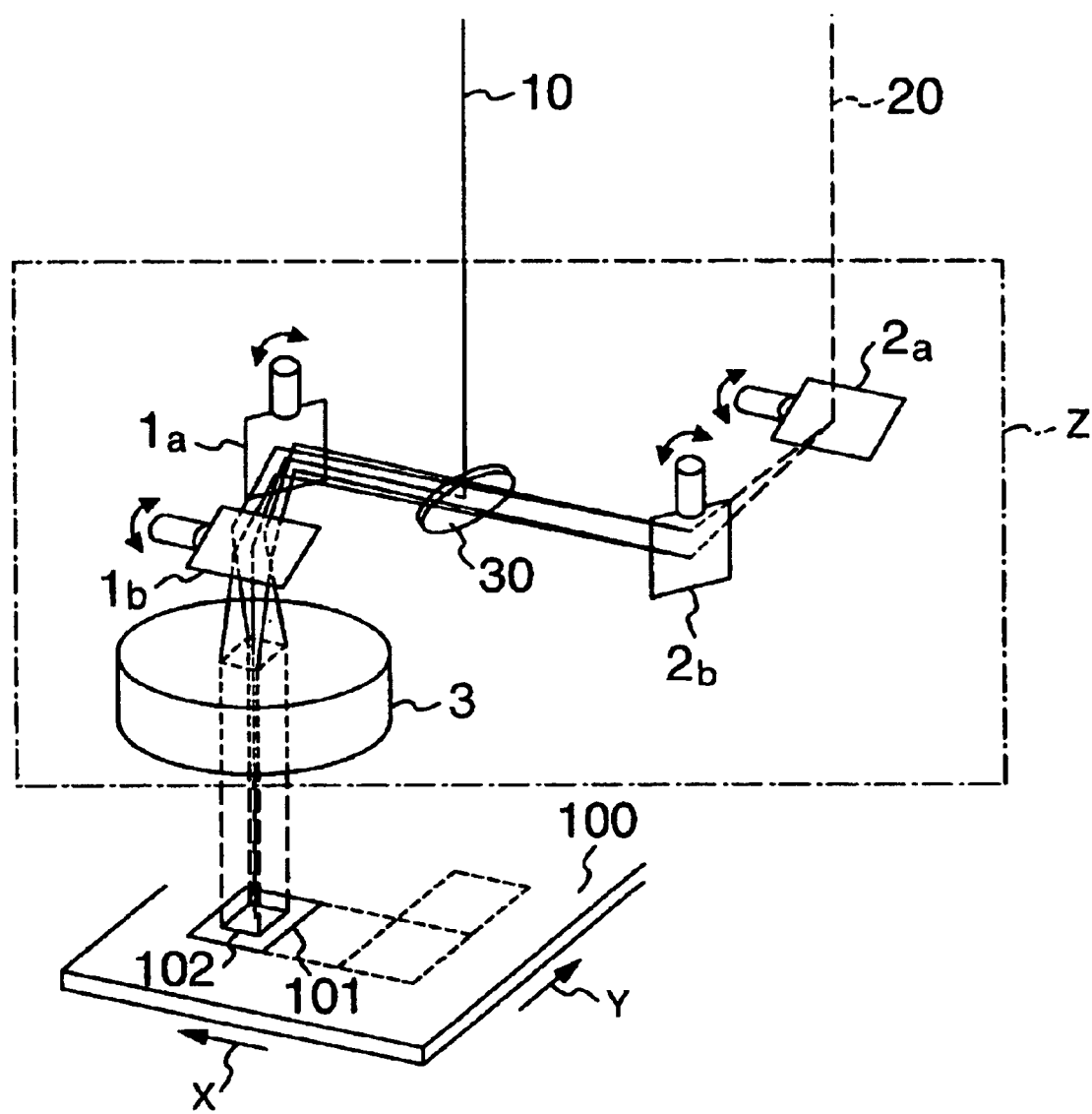
FIG. 1 is a view illustrating a laser head optical system according to the present invention.
Figure 2:
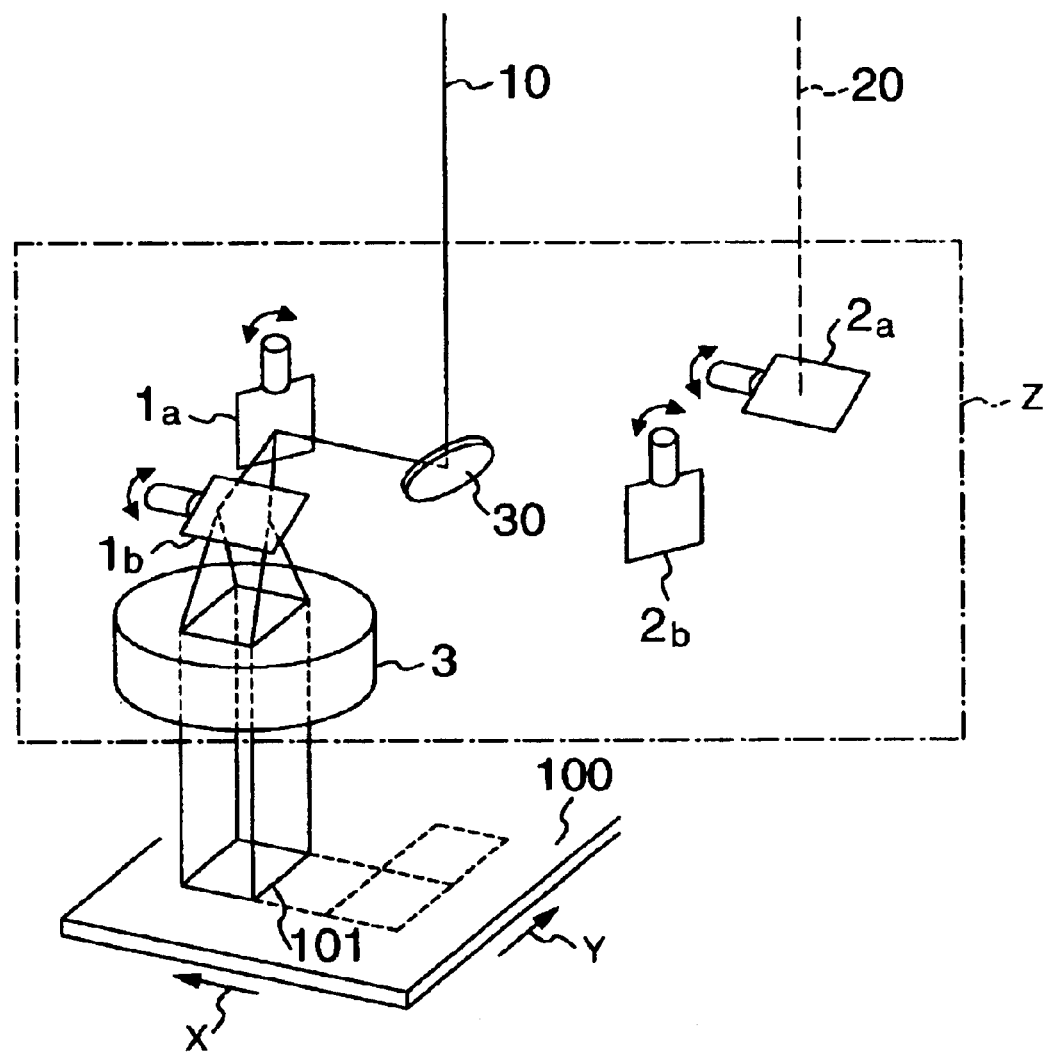
FIG. 2 is a view illustrating a positioning range of a firs laser beam in the laser head optical system according to the present invention.

Referring to FIGS. 1 and 2 which show a laser head optical system in an embodiment 1 of the present invention, there are shown a first galvanometer-mirror system composed of galvanometer mirrors 1a, 1b, a second galvanometer-mirror system composed of galvanometer mirrors 2a, 2b, an fθ lens 3, an S-polarized first laser beam 10, a P-polarized second laser beam 20, a printed circuit board 100 as a workpiece, a positioning range 101 of the first laser beam, a positioning range 102 of the second laser beam, and a laser head Z. The positioning range of the first laser beam 10 will be explained with reference to FIG. 2. Since the first laser beam 10 is S-polarized, after it is reflected by a polarized beam mixer 30, it is deflected by the first galvanometer-mirror system 1a, 1b and is then incident upon the fθ lens 3 so as to be positioned and converged in the range 101 on the printed circuit board 100 as a workpiece and is converged, similar to the conventional one. Next, the positioning range 102 of the second laser beam 20 will be explained with reference to FIG. 1. At this stage, explanation will be made in such a way that the first galvanometer-mirror system 1a, 1b is fixed to a center position, for the sake of simplification. Since the second laser beam 20 is deflected by the second galvanometer-mirror system 2a, 2b, and is P-polarized, it transmits through the polarized beam mixer 30 and is incident upon the first galvanometer-mirror system 1a, 1b and the fθ lens 3, and is then positioned and converged in the range 102 around the irradiated position of the first laser beam as a center. The reason why the positioning range for the second laser beam 20 is narrower than that of the first laser beam 10 is such that the laser beam falls out of the first galvanometer-mirror system 1a, 1b if the deflecting angle by the second galvanometer-mirror system 2a, 2b is too large. Further, telecentric errors at the fθ lens 3 become less if the deflecting angle in the second galvanometer-mirror system 1a, 1b is small.

<Embodiment 2>

Figure 3:
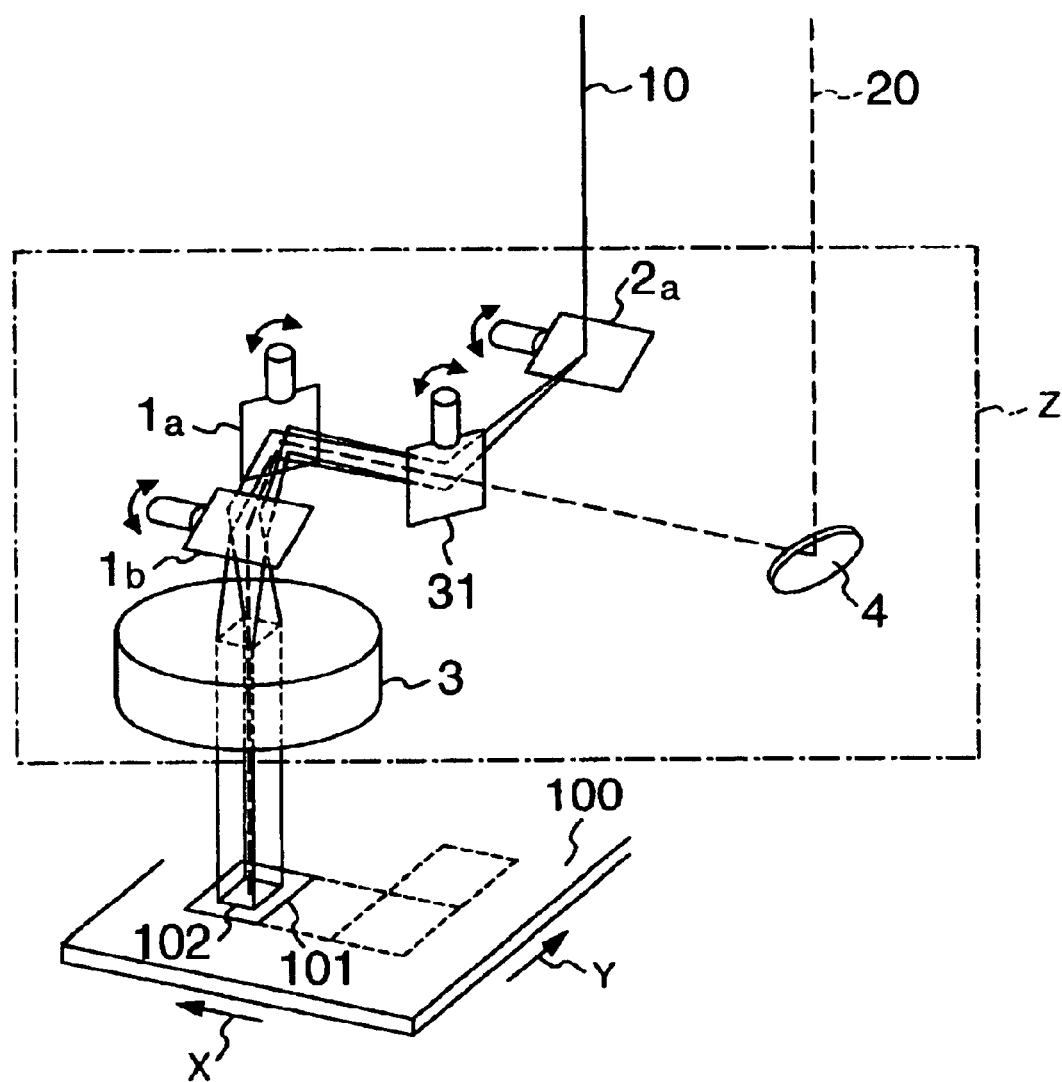
FIG. 3 is a view illustrating another laser head optical system according to the present invention.

Referring to FIG. 3 which shows a laser head optical system in an embodiment of the present invention, there are shown a first galvanometer-mirror system composed of galvanometer mirrors 1a, 1b, and a second galvanometer-mirror system composed of a rotatable mirror 2a and a rotatable polarized beam mixer 31, an fθ lens 3, a fixed mirror 4, an S-polarized second laser beam 10, a P-polarized first laser beam 20, a printed circuit board 100 as a workpiece, a positioning range 101 of the first laser beam, a positioning range 102 of the second laser beam. In this figure, similar to FIG. 1, the range 102 is a movable range of the second laser beam 10 when the first galvanometer-mirror system 1a, 1b is fixed. In this embodiment, since the second laser beam 10 is S-polarized, after it is reflected and deflected by the rotatable polarized beam mixer 31 and is then reflected by the first galvanometer-mirror system 1a, 1b, it is incident upon the fθ lens 3 so as to be positioned and converged within the range 102 around the irradiated position of the first laser beam 20 as a center. Meanwhile, since the first laser beam 20 is P-polarized, it transmits through the rotatable polarized beam mixer 31 and is positioned and converged, similar to the conventional one. In this embodiment, the second galvanometer-mirror system 2a, 31 can be located close to the first galvanometer-mirror system 1a, b, the positioning range 102 can be wider slightly than that of the embodiment 1.

<Embodiment 3>

Figure 4:
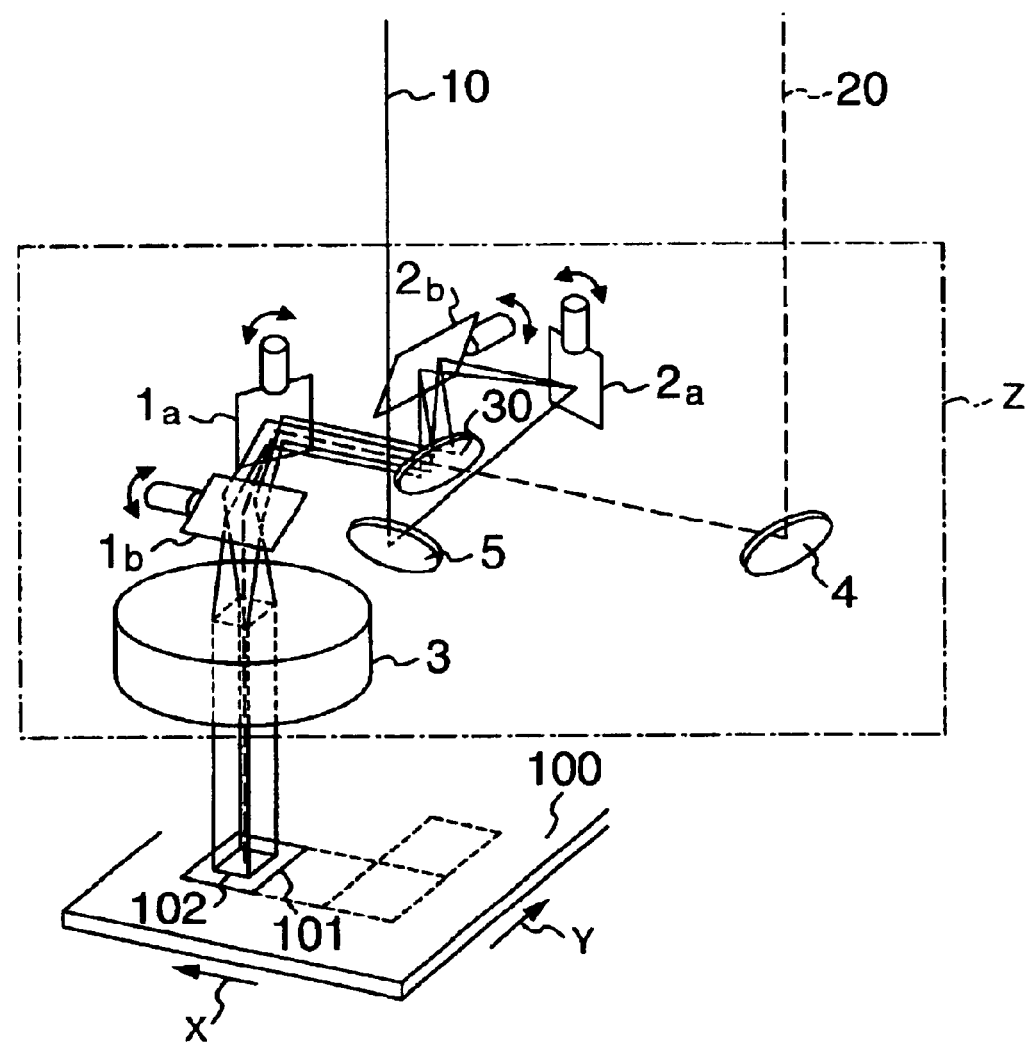
FIG. 4 is a view illustrating a further another laser head optical system according to the present invention.

Referring to FIG. 4 which shows a laser head optical system in an embodiment 4 of the present invention, there are shown a first galvanometer-mirror system composed of galvanometer mirrors 1a, 1b, a second galvanometer-mirror system composed of galvanometer mirrors 2a, 2b, an fθ lens 3, fixed mirrors 4 and 5, an S-polarized second laser beam 10, a P-polarized first laser beam 20, a printed circuit board 100 as a workpiece, a positioning range 101 of the first laser beam, a positioning range 102 of the second laser beam, and a laser head Z. In this figure, the positioning range 102 corresponds to a movable range of the second laser beam when the first galvanometer-mirror system 1a, 1b is fixed, similar to FIG. 1. The second laser beam 10 in this embodiment is reflected by the fixed mirror 5, and is deflected by the second galvanometer-mirror system, and since it is S-polarized, it is reflected by the polarized beam mixer 30, and is deflected by the first galvanometer-mirror system 1a, 1b. Then, it is incident upon the fθ lens 3, and is positioned and converged in the range 102 around the irradiates position of the first laser beam 20 as a center. Meanwhile, Since the first laser beam 20 reflected by the fixed mirror 4 is P-polarized, it transmits through the polarized beam mixer 30 and is positioned and converged, similar to the conventional one. In this embodiment, the second galvanometer-mirror system 2a, 2b can be located close to the first galvanometer-mirror system 1a, 1b, and since the deflecting range is determined only by an incident-angle-to-reflection characteristic of the polarized beam mixer 30, the positioning range 102 can be set to be substantially equal to the positioning range 101 of the first galvanometer-mirror system.

Further, as in this embodiment, by constituting the second galvanometer-mirror system so that the direction of the drive shaft of the X-axial galvanometer mirror 2a is coincident with the direction of the drive shaft of the X-axial galvanometer mirror 1a of the first galvanometer-mirror system while the direction of the drive shaft of the Y-axial galvanometer mirror 2b is made orthogonal to the direction of the drive shaft of the Y-axial galvanometer mirror 1b of the first galvanometer-mirror system, spatial interference between motors for driving the mirrors can be reduced. Thus, the galvanometer mirrors 1a, 1b, 2a, 2b can be located closer to one another, and accordingly, telecentric errors of the fθ lens can be further reduced, thereby it is possible to downsize the apparatus. Further, since the galvanometer mirrors can be located closer to one another, the scanning width of the second laser beam 10 can be decreased on the galvanometer mirrors 1a, 1b, and accordingly, the sizes of the galvanometer mirrors 1a, 1b can be decreased. With this arrangement, the inertia becomes small, and accordingly, there is offered such an advantage that the high responsiveness of the galvanometer mirrors 1a, 1b can be enhanced.

<Embodiment 4>

Figure 5:
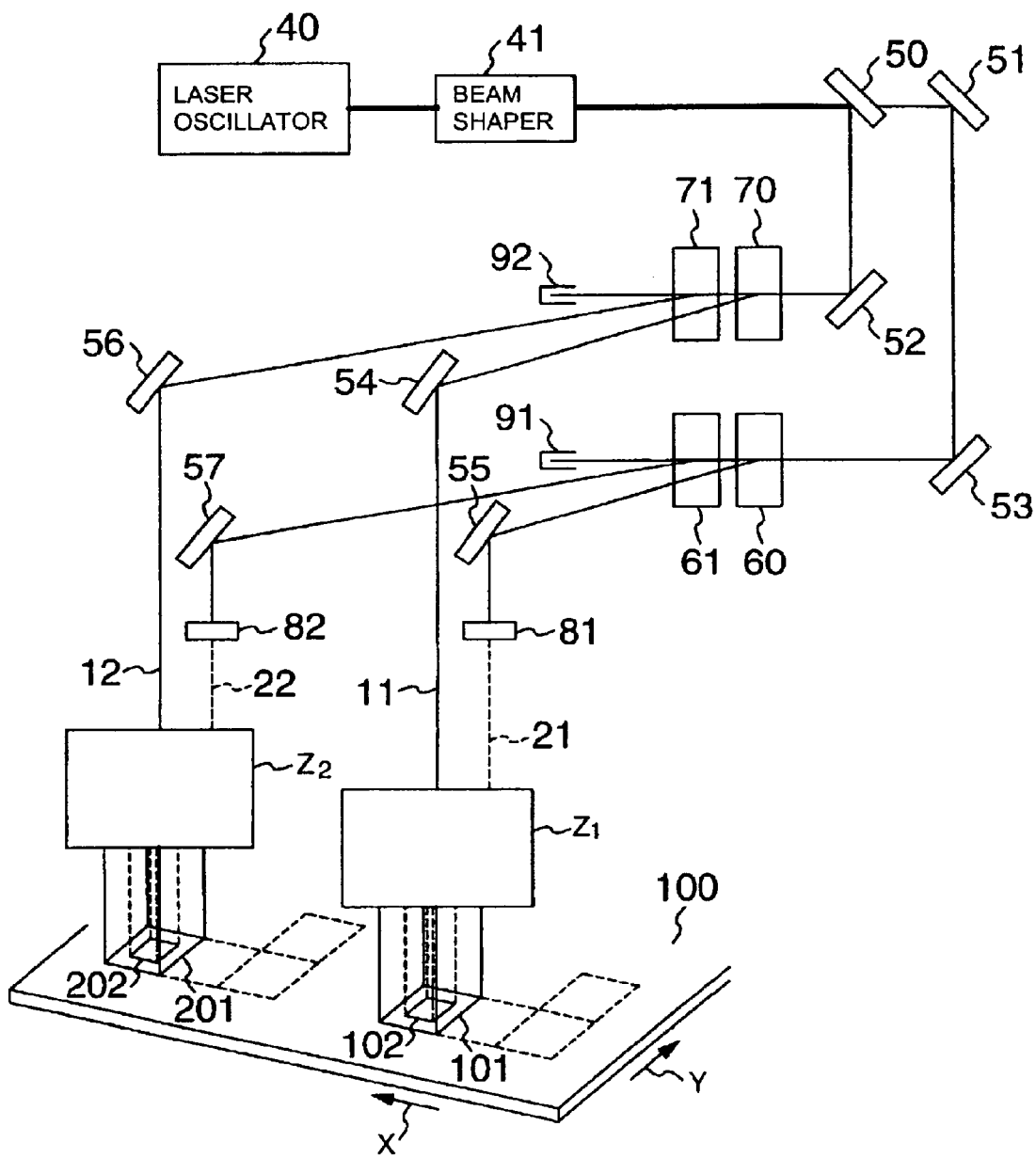
FIG. 5 is a view illustrating an apparatus which is composed of a plurality of laser heads according to the present invention.

Referring to FIG. 5 which shows an example of an apparatus which incorporates a plurality of laser heads according to the present invention, laser heads $Z_1$, $Z_2$ corresponding to the laser head stated in the embodiment 1, S-polarized first pulsed laser beams 11, 12, P-polarized second laser beams 21, 22, a laser oscillator 40, a beam shaper 41 for homogenizing a beam intensity distribution, a half mirror 50, fixed mirrors 51 to 57, optical deflectors 60, 61, 70, 71, half-wave plate 81, 82, beam dampers 91, 92, a printed circuit board 100 as a workpiece, positioning ranges 101, 201 of the first pulsed laser beams 11, 12, and positioning ranges 102, 202 of the second pulsed laser beams 21, 22. A $CO_2$ gas laser is used as the laser oscillator 4, and acousto-optic deflectors are used as the optical deflectors. In this embodiment, although the half-wave plates 81, 82 are used as means for rotating the polarization direction by 90 degrees, there may be used such a phenomenon that the polarization direction is rotated by 90 degrees when the height and the direction of the light path are changed with two mirrors by an deflection angle of 90 degrees.

A linearly polarized (S-polarized) pulsed laser beam emitted from the laser oscillator is divided into two beams by the half-mirror 50 after its intensity distribution is unformed by the beam shaper 41, and is then led to the optical deflectors 60, 61, 70, 71. When the optical deflectors 60, 70 are activated in synchronization with each other, the pulsed laser beams are simultaneously branched toward the fixed mirrors 54, 55. Thereafter, one of the pulsed laser beams transmits through the half-wave plate 81 so as to rotate its polarization direction by 90 degrees, and is incident upon the laser head $Z_1$.

When the optical deflectors 61, 71 are activated in synchronization with each other for the next pulsed laser beams, the pulsed laser beams are simultaneously branched toward the fixed mirrors 56, 57. Thereafter, one of the laser beams transmits through the half-wave plate 82 so as to be rotated by 90 degrees, and is then incident upon the laser head $Z_2$.

In this embodiment, since the pulsed laser beams which has been simultaneously generated are incident upon the laser heads as the first and the second pulsed laser beams for each laser head, there is a waiting time corresponding to pulse periods until the second laser head completes its process after the first laser head completes its process. This waiting time can be used for the positioning operation of the galvanometer mirror systems for the next processing positions.

It is noted here that the optical deflectors 60, 61, 70, 71 are preferably located close to each other so that the pulsed laser beams deflected by the optical deflectors 60, 70 transmits through the optical deflectors 61, 71. With this configuration, for example, both pulsed laser beams 11, 12 transmit through the optical deflectors 70, 71, the affection by the thermal lens effects of the optical deflectors can be substantially equal to each other between the pulsed laser beams 11, 12.

In this embodiment, although two laser heads are used, more than two laser heads may be used in a similar configuration by increasing the number of the optical deflectors.

Further, in this configuration, the laser heads corresponding to the laser head in the embodiment 1 are used, the laser head corresponding to the embodiment 2 or 3 may be used with the same configuration as that stated above, except that the first pulsed laser beam is P-polarized while the second pulsed laser beam is S-polarized.

<Embodiment 5>

Figure 6:
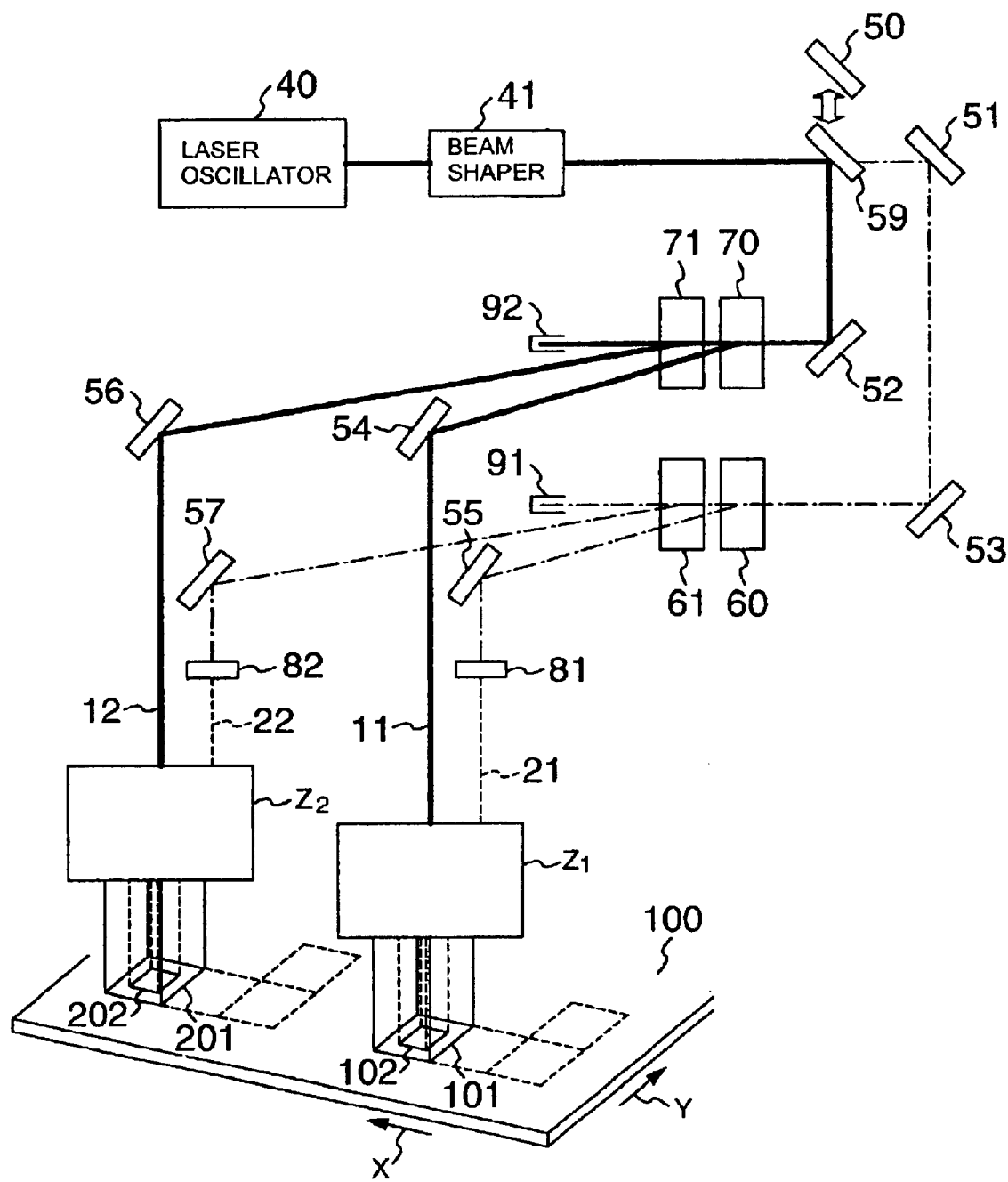
FIG. 6 is a view illustrating an apparatus which is composed of a plurality of laser heads according to the present invention.

FIG. 6 is an example having the same configuration as that of the embodiment 4, except that the half-mirror 50 and a complete reflection mirror 50 can be selectively and alternatively used.

In the case of splitting a laser beam with the half-mirror 50, the energy of each of the divided laser beams becomes half, and accordingly, it is difficult to drill a large diameter hole having a diameter not less than 200 $\mu$m with this laser beam. In this case, the complete reflection mirror 51 is used so as to efficiently drill the hole (since the energy which is twice as high as that obtained by the half-mirror, can be used, a hole having a diameter which is about 1.4 times as large as that can be drilled when the half-mirror is used).

On the other hand, even with the configuration of the embodiment 4, a hole having a large diameter as mentioned above can be drilled by setting the first laser beams and the second laser beams by the laser heads $Z_1$, $Z_2$ to one and the same processing position. However, the number of optical components the laser beams transmit through becomes larger, and accordingly, the energy loss becomes higher than that of this embodiment.

There may be such a configuration that the half-mirror 50 is removed from the optical path so as to directly pass a laser beam, instead of selectively use the complete reflection mirror. In this case, since the optical system for the second laser beam is adjusted to the refractive index of the half-mirror 50, an optical shift caused by the removal of the half-mirror 50 has to be compensated in such a way that a compensator having the same refractive index and the same thickness as those of the half-mirror is inserted and so forth.

Since the galvanometer mirrors can be located close to the f$\theta$ lens by using a conventional optical system using galvanometer mirrors, occurrence of telecentric errors can be prevented. As to the second laser beams, after it is reflected by the second galvanometer-mirror system, it is transmitted through or reflected by the polarized beam mixer and is then incident upon the first galvanometer-mirror system and the f$\theta$ lens, and accordingly, with the use of both the first and the second laser beams, two positions on the circuit board can be processed.

Two laser beams into which the pulsed laser beam emitted from the single laser oscillator is divided by the half-mirror, are deflected and tail-cut through the optical deflectors, and thereafter, one of them is S-polarized while the other one of them is P-polarized, thereby it is possible to process a workpiece at two positions with the use of a plurality of laser heads.

What is claimed is:

1. A multi-beam laser drilling apparatus having a laser head for drilling a workpiece, simultaneously at two positions with the use of first and second laser beams, comprising:

a first galvanometer-mirror system, a second galvanometer-mirror system, a polarized beam mixer, a first laser beam is S-polarized and reflected by the polarized beam mixer toward the first galvanometer-mirror system, a second laser beam is P-polarized, deflected by the second galvanometer-mirror system toward the first galvanometer-mirror system and transmitted by the polarized beam mixer, and an f$\theta$ lens for converging and positioning the first and the second laser beams deflected by the first galvanometer-mirror system on the workpiece.

2. A multi-beam laser drilling apparatus as set forth in claim 1, wherein a linearly polarized pulsed laser beam emitted from a single laser generator is divided into two beams by a half mirror, and optical deflectors are provided in each of the optical paths for the divided laser beams which therefore branch into a plurality of optical paths for every pulse, so as to combine simultaneous pulsed laser beams, the polarization direction of one of the divided laser beams is rotated by 90 degrees, so as to obtain one group of first and second pulsed laser beams, and pulses generated other times are combined so as to obtain other groups of pulsed laser beams, the groups of pulsed laser beams are led to a plurality of laser heads.

3. A multi-beam laser drilling apparatus as set forth in claim 2, wherein an optical system in which two optical deflectors are provided in an optical path for a pulsed laser beam so as to cause the pulsed laser beam to branch into two optical paths for every pulse, is used, and a distance between the two deflectors are adjusted so that the pulsed laser beam deflected by an optical deflector transmits through the next optical deflector.

4. A multi-beam laser drilling apparatus as set forth in claim 2, wherein the half-mirror for dividing a pulsed laser beam and a complete reflection mirror are selectively and alternatively used.

5. A multi-beam laser drilling apparatus having a laser head for drilling a workpiece, simultaneously at two positions with the use of first and second laser beams, comprising:

a first galvanometer-mirror system, a second galvanometer-mirror system, one of whose mirrors is a rotatable polarized beam mixer, a first laser beam is P-polarized and passes through the rotatable polarized beam mixer toward the first galvanometer-mirror system, a second laser beam is S-polarized, deflected by the second galvanometer-mirror system toward the first galvanometer-mirror system, and an f$\theta$ lens for converging and positioning the first and the second laser beams deflected by the first galvanometer-mirror system on the workpiece.

6. A multi-beam laser drilling apparatus as set forth in claim 5, wherein a linearly polarized pulsed laser beam emitted from a single laser generator is divided into two beams by a half mirror, and optical deflectors are provided in each of the optical paths for the divided laser beams which therefore branch into a plurality of optical paths for every pulse, so as to combine simultaneous pulsed laser beams, the polarization direction of one of the divided laser beams is rotated by 90 degrees, so as to obtain one group of first and second pulsed laser beams, and pulses generated other times are combined so as to obtain other groups of pulsed laser beams, the groups of pulsed laser beams are led to a plurality of laser heads.

7. A multi-beam laser drilling apparatus as set forth in claim 6, wherein an optical system in which two optical deflectors are provided in an optical path for a pulsed laser beam so as to cause the pulsed laser beam to branch into two optical paths for every pulse, is used, and a distance between the two deflectors are adjusted so that the pulsed laser beam deflected by an optical deflector transmits through the next optical deflector.

8. A multi-beam laser drilling apparatus as set forth in claim 6, wherein the half-mirror for dividing a pulsed laser beam and a complete reflection mirror are selectively and alternatively used.

9. A multi-beam laser drilling apparatus having a laser head for drilling a workpiece, simultaneously at two positions with the use of first and second laser beams, comprising:
  a first galvanometer-mirror system,
  a second galvanometer-mirror system,
  a polarized beam mixer,
  a first laser beam is P-polarized and passes through the polarized beam mixer toward the first galvanometer-mirror system,
  a second laser beam is S-polarized, deflected by the second galvanometer-mirror system and reflected by the polarized beam mixer toward the first galvanometer-mirror, and
  an fθ lens for converging and positioning the first and the second laser beams deflected by first galvanometer-mirror system on the workpiece.

10. A multi-beam laser drilling apparatus as set forth in claim 9, wherein a linearly polarized pulsed laser beam emitted from a single laser generator is divided into two beams by a half mirror, and optical deflectors are provided in each of the optical paths for the divided laser beams which therefore branch into a plurality of optical paths for every pulse, so as to combine simultaneous pulsed laser beams, the polarization direction of one of the divided laser beams is rotated by 90 degrees, so as to obtain one group of first and second pulsed laser beams, and pulses generated other times are combined so as to obtain other groups of pulsed laser beams, the groups of pulsed laser beams are led to a plurality of laser heads.

11. A multi-beam laser drilling apparatus as set forth in claim 10, wherein an optical system in which two optical deflectors are provided in an optical path for a pulsed laser beam so as to cause the pulsed laser beam to branch into two optical paths for every pulse, is used, and a distance between the two deflectors are adjusted so that the pulsed laser beam deflected by an optical deflector transmits through the next optical deflector.

12. A multi-beam laser drilling apparatus as set forth in claim 10, wherein the half-mirror for dividing a pulsed laser beam and a complete reflection mirror are selectively and alternatively used.

13. A multi-beam laser drilling apparatus as set forth in claim 9, wherein the direction of the drive shaft of the X-axial galvanometer mirror of the second galvanometer-mirror systems is coincident with the direction of the drive shaft of the X-axial galvanometer mirror of the first galvanometer-mirror system but the direction of the drive shaft of the Y-axial galvanometer mirror is made orthogonal to the direction of the drive shaft of the Y-axial galvanometer mirror of the first galvanometer-mirror system.

14. A multi-beam laser drilling apparatus as set forth in claim 13, wherein a linearly polarized pulsed laser beam emitted from a single laser generator is divided into two beams by a half mirror, and optical deflectors are provided in each of the optical paths for the divided laser beams which therefore branch into a plurality of optical paths for every pulse, so as to combine simultaneous pulsed laser beams, the polarization direction of one of the divided laser beams is rotated by 90 degrees, so as to obtain one group of first and second pulsed laser beams, and pulses generated other times are combined so as to obtain other groups of pulsed laser beams, the groups of pulsed laser beams are led to a plurality of laser heads.

15. A multi-beam laser drilling apparatus as set forth in claim 14, wherein an optical system in which two optical deflectors are provided in an optical path for a pulsed laser beam so as to cause the pulsed laser beam to branch into two optical paths for every pulse, is used, and a distance between the two deflectors are adjusted so that the pulsed laser beam deflected by an optical deflector transmits through the next optical deflector.

16. A multi-beam laser drilling apparatus as set forth in claim 14, wherein the half-mirror for dividing a pulsed laser beam and a complete reflection mirror are selectively and alternatively used.

17. A multi-beam laser drilling apparatus, wherein an optical system in which optical deflectors are provided in an optical path for a pulsed laser beam so as to cause the pulsed laser beam to branch into two optical paths for every pulse, is used, and a distance between the two deflectors are adjusted so that the pulsed laser beam deflected by an optical deflector transmits through the next optical deflector.

* * * * *